United States Patent
Elmer et al.

(10) Patent No.: US 7,288,772 B2
(45) Date of Patent: Oct. 30, 2007

(54) DIAGNOSTIC SYSTEM FOR PROFILING MICRO-BEAMS

(75) Inventors: John W. Elmer, Danville, CA (US);
Todd A. Palmer, Livermore, CA (US);
Alan T. Teruya, Livermore, CA (US);
Chris C. Walton, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 359 days.

(21) Appl. No.: 11/116,697

(22) Filed: Apr. 27, 2005

(65) Prior Publication Data

US 2005/0242299 A1 Nov. 3, 2005

Related U.S. Application Data

(60) Provisional application No. 60/566,544, filed on Apr. 28, 2004.

(51) Int. Cl.
*G01J 1/00* (2006.01)
*G03C 5/00* (2006.01)
*G01R 13/00* (2006.01)

(52) U.S. Cl. ............... 250/397; 250/305; 250/306; 250/396 R; 250/491.1

(58) Field of Classification Search ............... 250/397
See application file for complete search history.

(56) References Cited

U.S. PATENT DOCUMENTS 5,382,895 A 1/1995 Elmer et al.
5,468,966 A 11/1995 Elmer et al.

(Continued)

OTHER PUBLICATIONS

Elmer, J. W., et al., "An Enhanced Faraday Cup for Rapid Determination of Power Density Distribution in Electron Beams," Welding Journal, 80 (12), pp. 288s-295s, Dec. 2001.

(Continued)

*Primary Examiner*—Robert Kim
*Assistant Examiner*—Bernard Souw
(74) *Attorney, Agent, or Firm*—Eddie E. Scott; John H. Lee

(57) ABSTRACT

An apparatus for characterization of a micro beam comprising a micro modified Faraday cup assembly including a first layer of material, a second layer of material operatively connected to the first layer of material, a third layer of material operatively connected to the second layer of material, and a fourth layer of material operatively connected to the third layer of material. The first layer of material comprises an electrical conducting material and has at least one first layer radial slit extending through the first layer. An electrical ground is connected to the first layer. The second layer of material comprises an insulating material and has at least one second layer radial slit corresponding to the first layer radial slit in the first layer of material. The second layer radial slit extends through the second layer. The third layer of material comprises a conducting material and has at least one third layer radial slit corresponding to the second layer radial slit in the second layer of material. The third layer radial slit extends through the third layer. The fourth layer of material comprises an electrical conducting material but does not have slits. An electrical measuring device is connected to the fourth layer. The micro modified Faraday cup assembly is positioned to be swept by the micro beam.

52 Claims, 4 Drawing Sheets

U.S. PATENT DOCUMENTS

| | | | |
|---|---|---|---|
| 5,554,926 A | | 9/1996 | Elmer et al. |
| 5,583,427 A | * | 12/1996 | Teruya et al. ............... 324/71.3 |
| 5,825,035 A | * | 10/1998 | Mizumura et al. ...... 250/423 R |
| 6,300,755 B1 | * | 10/2001 | Elmer et al. ................ 324/71.3 |
| 6,753,253 B1 | * | 6/2004 | Takahashi et al. ........... 438/676 |
| 2004/0026627 A1 | * | 2/2004 | Nakayama et al. ......... 250/397 |
| 2005/0242299 A1 | * | 11/2005 | Elmer et al. ............. 250/491.1 |
| 2005/0285047 A1 | * | 12/2005 | Elmer et al. ................ 250/397 |
| 2006/0038139 A1 | * | 2/2006 | Elmer et al. ........... 250/492.23 |

OTHER PUBLICATIONS

Elmer, John W., et al, "Beam Profile Analysis for the C&MS B231 Electron Beam Welding Machines," Lawrence Livermore National Laboratory, LLNL UCRL-IS-127549, Jun. 12, 1997.

Elmer, J. W., "Fast Method for Measuring Power Density Distribution of Non-Circular and Irregular Electron Beams," Science and Technology of Welding and Joining, vol. 3, No. 2, pp. 51-58, 1998.

Teruya, Alan, et al., "A System for the Tomographic Determination of the Power Distribution in Electron Beams," The Laser and Electron in Welding, Cutting, and Surface Treatment State-of-the-Art 1991, Bakish Materials Corp., pp. 125-140, 1991.

Elmer, J. W., et al., "Tomographic Imaging of Noncircular and Irregular Electron Beam Current Density Distributions," Welding Journal 72 (ii), pp. 493s-505s, Nov. 1993.

* cited by examiner

DIAGNOSTIC SYSTEM FOR PROFILING MICRO-BEAMS

CROSS-REFERENCE TO RELATED APPLICATIONS

This application claims the benefit of U.S. Provisional Patent Application No. 60/566,544 filed Apr. 28, 2004 and titled "Micro-Joining Using Electron Beams." U.S. Provisional Patent Application No. 60/566,544 filed Apr. 28, 2004 and titled "Micro-Joining Using Electron Beams" is incorporated herein by this reference.

The United States Government has rights in this invention pursuant to Contract No. W-7405-ENG-48 between the United States Department of Energy and the University of California for the operation of Lawrence Livermore National Laboratory.

BACKGROUND

1. Field of Endeavor

The present invention relates to electron beams and more particularly to a diagnostic system for profiling micro-beams of charged particles such as electrons or ions.

2. State of Technology

U.S. Pat. No. 6,300,755 for enhanced modified faraday cup for determination of power density distribution of electron beams issued to John W. Elmer and Alan T. Teruya Oct. 9, 2001 provides the following state of technology information, "Electron beams are considered to be the most precise and clean method available for welding thick sections of materials. Unfortunately, electron beams suffer one critical deficiency, namely the repeatability of focusing the beam to a known power density. Without the ability to reliably reproduce the power distribution in an electron beam, weld quality cannot be guaranteed. This problem is exacerbated by the fact that many welds are made over a period of time and with different welding operators. Further complications arise when welds are developed on one machine than transferred to a different machine for production. An electron beam diagnostic method has been developed that enables the precise characterization of the power density distribution in high power electron beams. Such diagnostic method, which utilizes a modified Faraday cup, is exemplified by U.S. Pat. Nos. 5,382,895, 5,468,966, 5,554,926 and 5,583,427. This electron beam diagnostic method has been utilized, for example, to certify changes in electron beam welders, and is further described in J. W. Elmer et al, "Tomographic Imaging of Non-Circular and Irregular Electron Beam Power Density Distributions," Welding Journal 72 (ii), p. 493-s, 1993; A. T. Teruya et al, "A System for the Tomographic Determination of the Power Distribution in Electron Beams," The Laser and Electron Beam in Welding, Cutting, and Surface Treatment State-of-the-Art 1991, Bakish Materials Corp., p. 125, 1991; and J. W. Elmer et al, "Beam Profile Analysis for the C&MS B231 Electron Beam Welding Machines," LLNL UCRL-ID-127549, Jun. 12, 1997."

SUMMARY

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides an apparatus for characterization of a micro beam. The apparatus comprises a micro modified Faraday cup assembly positioned to be swept by the micro beam. The micro modified Faraday cup assembly comprises a first layer of material, the first layer of material comprising an electrical conducting refractory material and having at least one first layer radial slit extending through the first layer; an electrical ground connected to the first layer; a second layer of material operatively connected to the first layer of material, the second layer of material comprising an insulating material and having at least one second layer radial slit that is aligned with the first layer radial slit, the second layer radial slit extending through the second layer; a third layer of material operatively connected to the second layer of material, the third layer of material comprising a conducting material and having at least one third layer radial slit that is aligned with the second layer radial slit, the third layer radial slit extending through the third layer; a fourth layer of material operatively connected to the third layer of material, the fourth layer comprising an electrical conducting material; and an electrical measuring device connected to the fourth layer.

In another embodiment of the apparatus for characterization of a micro beam, the third layer of material and the fourth layer of material comprise a single unit. Another embodiment of the apparatus for characterization of a micro beam includes a positioning system operatively connected to the micro modified Faraday cup assembly for changing the position of the micro modified Faraday cup assembly relative to the micro beam. Embodiments of the apparatus for characterization of a micro beam include a control and data acquisition system operatively connected to the electrical measuring device that uses a computed tomographic method to capture and process information about the micro beam. Embodiments of the apparatus for characterization of a micro beam include a first layer hole in the first layer of material, a second layer hole in the second layer of material, and a third layer hole in the third layer of material that act as a conventional Faraday cup whereby the micro beam can be positioned directly above the first layer hole, the second layer hole, and the third layer hole to measure the full micro beam current.

The present invention also provides a method for rapidly measuring the power density distribution of a micro electron or an ion beam. The method captures multiple micro beam profiles at different radial angles in a fraction of a second as the beam is oscillated in a circular pattern over the micro modified Faraday cup assembly. The individual beam profiles are then reconstructed using a computed tomographic method to render an image of the beam shape, size, and power density distribution. The data is gathered and displayed within seconds, enabling near real time adjustments to be made to correct beam problems such as focusing irregularities, beam astigmatism, and other effects leading to non-symmetric or non-optimum beams. In addition to correcting beam problems, the micro modified Faraday cup assembly and control and data acquisition system provide a permanent record of the beam for quality control purposes, a system to repeat the same beam quality on the same machine over a period of time, and a system to transfer beam quality characteristics to multiple machines.

The present invention has use for characterization of micro electron beams used for electron microscopy (scanning or transmission), micro charged particle beams used for micro-joining applications, and micro ion beams or focused ion beams used for ion implantation or characterization. The present invention can be used for characterization of any charged particle beams used for lithography, or ion implantation on a micro scale.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF THE INVENTION

Figure 1:
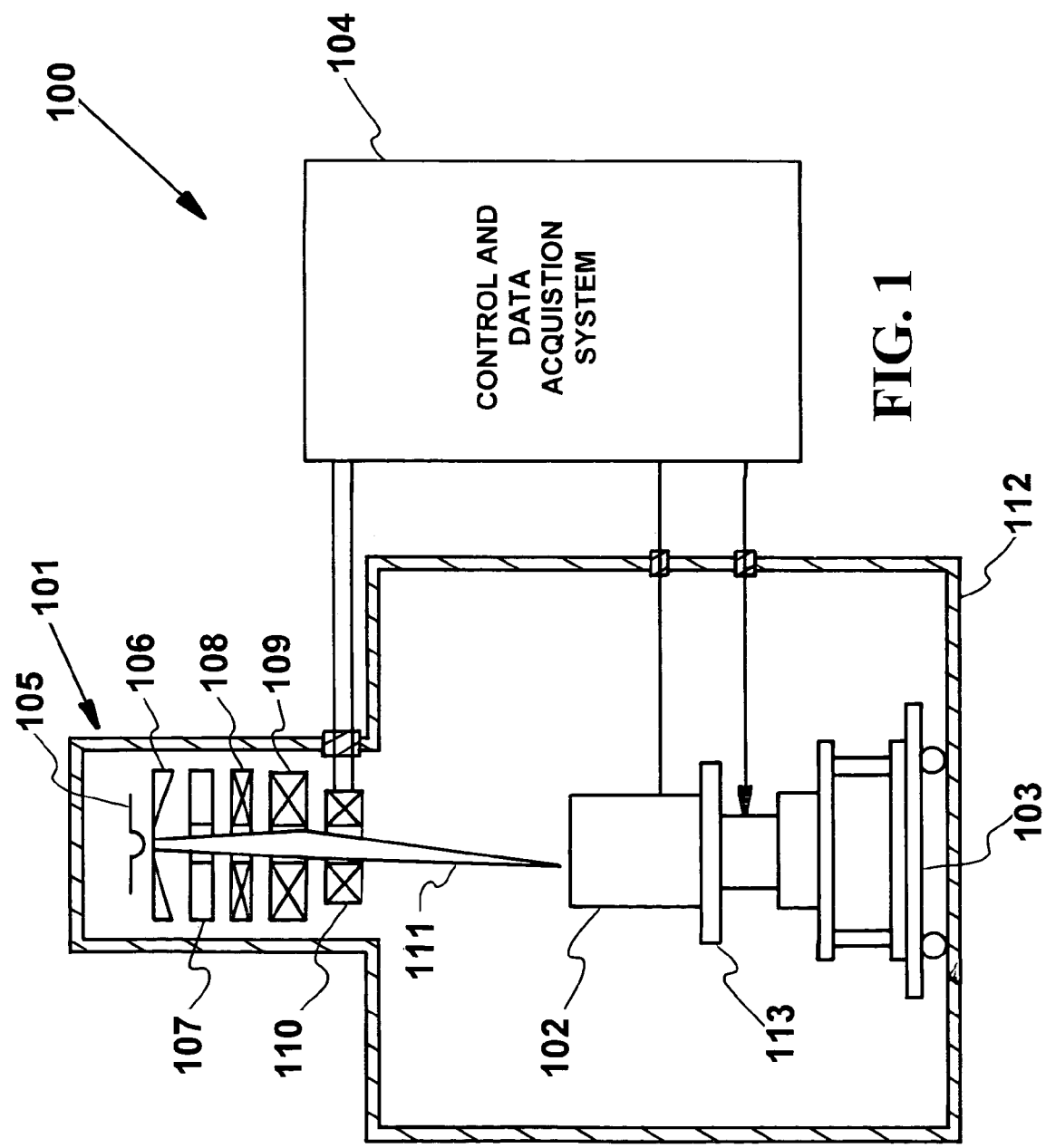
FIG. 1 is an illustration of one embodiment of a diagnostic system for micro beams constructed in accordance with the present invention.

Referring to the drawings, to the following detailed description, and to incorporated materials, detailed information about the invention is provided including the description of specific embodiments. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

Many of the diagnostic methods for measuring the power density distribution in electron beams are variations of the Faraday cup. A version of the Faraday cup diagnostic method consists of an electrically conductive trap, which contains and measures the beam current. Modifications to the Faraday cup are required for measuring the beam's power density distribution so that only a selected portion of the beam enters the cup at any one time. One type of Faraday cup isolates a portion of the beam by placing a single slit or knife-edge above the Faraday cup while the beam is swept over this slit. This technique measures the beam's intensity along the sweep direction and provides a one-dimensional profile of the beam. By maximizing the amplitude of the profile measured through the slit while adjusting the focus, the minimum beam width, which corresponds to the sharpest focus along this direction, can be determined. This technique provides a one-dimensional view of the beam along the sweep direction and is useful for inspecting beams with radial symmetry; however, if the beam is non-circular or has an irregular power distribution then more sophisticated techniques are required to map the power density distribution in the beam.

Pinhole devices have also been used to measure the power distribution of irregular-shaped electron beams. Pinhole measurements are made using a small aperture (<10% of the beam diameter) placed over a Faraday cup. The electron beam sweeps over the pinhole several times at regularly spaced intervals to provide enough information to map the power density distribution in the beam. The drawbacks of this technique are that variations in the side-to-side position of the beam on successive sweeps can lead to errors in the measured power density distribution, and that this device has a relatively low signal-to-noise ratio since the pinhole collects only a small percentage of the beam's current.

Computed tomography (CT) coupled with a modified Faraday cup (MFC) technique was developed at Lawrence Livermore National Laboratory as an improvement to the above methods for measuring the power density distribution of high power electron beams used for welding. The Lawrence Livermore National Laboratory device consists of a Faraday cup assembly within an electrically insulating ceramic cup, a tungsten disk containing 17 thin radially positioned slits (0.1 mm wide each), and a cylindrical copper heat sink that holds the tungsten disk above the Faraday cup. During operation, the electron beam deflection coils are used to sweep the beam in a circle of known diameter and at a constant frequency over the tungsten slit disk. The majority of the beam's current is intercepted by the tungsten disk and is conducted by the copper heat sink to ground. However, when the beam passes over a slit, a portion of the beam current passes through the slit and into the Faraday cup where it can be measured as a voltage drop across a known resistor. A current versus time profile is collected using a fast sampling analog to digital converter as the beam passes over each slit. This beam profile information is used to CT reconstruct the power density distribution in the beam.

The Lawrence Livermore National Laboratory method is less sensitive to side-to-side variations in the beam's position than pinholes, has a higher signal-to-noise ratio than pinholes since a substantially larger portion of the beam is captured during each sweep, and rapidly provides a quantitative measure of the power density distribution of the beam. Although this technique provides the most accurate measurement of the power density distribution of electron or other charged particle beams, it was designed for relatively large beams used for welding (>1 mA current, >0.1 mm diameter), and has slits too large to measure the properties of micro beams.

Referring now to the drawings and in particular to FIG. 1, an illustration of one embodiment of a diagnostic system for micro beams constructed in accordance with the present invention is shown. The diagnostic system is designated generally by the reference numeral 100. The system 100 includes structural components that provide a diagnostic system for micro beams for taking electron beam profile data. The diagnostic system 100 involves four interconnected components or systems: an electron beam gun system generally indicated by the reference numeral 101, a micro modified Faraday cup (MFC) system generally indicated by the reference numeral 102, a positioning system generally indicated by the reference numeral 103, and a control and data acquisition system generally indicated by the reference numeral 104. The components are contained in a vacuum chamber 112.

The electron beam gun system 101, is a system such as a system that may be used in a welding machine, a system that may be used for electron microscopy (scanning or transmission), a system that may be used for micro-joining applications, or a system that may be used for ion implantation or characterization. The electron beam gun system 101 basically comprises a filament 105, cathode 106, anode 107, alignment coil 108, a magnetic lens 109, and deflection coils 110. The filament 105 may be of any desired cathode configuration, such as a ribbon type.

The electron beam is indicated at 111. The beam 111 is moved via deflection coils 110 and this movement is generally indicated by the double arrow near the lower end of the beam 111. In operation the beam 111 is swept across the slits in the micro modified Faraday cup system 102. The beam 111 is swept around the micro modified Faraday cup system 102 in a circular pattern to enter the slits. The various components of the gun 101, filament 105, cathode 106, anode 107, alignment coil 108, a magnetic lens 109, and deflection coils 110 and details of operation of the gun 101, the filament 105, cathode 106, anode 107, alignment coil 108, a magnetic lens 109, and deflection coils 110 are known in the art and need not be described further here.

The micro modified Faraday cup assembly 102 includes four layers of materials comprising a top (first) layer, a (second) middle layer, a (third) middle layer, and a bottom (fourth) layer. The four layers will be described in greater detail subsequently in connection with other drawing figures. The four layers are mounted or fabricated on an electrically insulating support 113. The four layers and the electrically insulating support are mounted on the rotatable/movable MFC assembly 103.

The positioning stage 103 utilizes a rotatable/movable member or stage system to position the micro modified Faraday cup (MFC) system 102. The positioning stage 103 includes X, Y and Z translation stages, providing capability of movement in the X, Y, and Z directions as indicated by the double arrows. The positioning stage 103 also includes rotational stage providing the capability of rotational movement of the Faraday cup (MFC) system 102 as indicated by the arrow θ.

Mounting the micro modified Faraday cup system 102 onto the positioning stage 103 allows for controlled, repeated positioning of the micro modified Faraday cup (MFC) system 102. The positioning stage 103 provides a system for enabling the micro Faraday cup (MFC) system 102 to be positioned at the desired location in the chamber. In operation, beam waveforms are taken by sweeping the beam 111 around the micro modified Faraday cup assembly 102. Additional details and structural elements of the positioning stage 103 are not shown because they are known in the art.

The control and data acquisition system 104 functions to control the micro modified Faraday cup (MFC) system 102 as well as processing and storing the acquired data. Various details and operations of the control and data acquisition system 104 will be described subsequently in connection with the operation of the diagnostic system 100. Basic details and structural elements of the control and data acquisition system 104 are not shown or discussed here because they are systems known in the art.

Some of the elements of the diagnostic system 100 are the same as or similar to the systems shown and described in U.S. Pat. Nos. 5,382,895, 5,468,966, 5,554,926, 5,583,427, and 6,300,755. The disclosures of U.S. Pat. Nos. 5,382,895, 5,468,966, 5,554,926 5,583,427, and 6,300,755 are incorporated herein by this reference.

Figure 2:
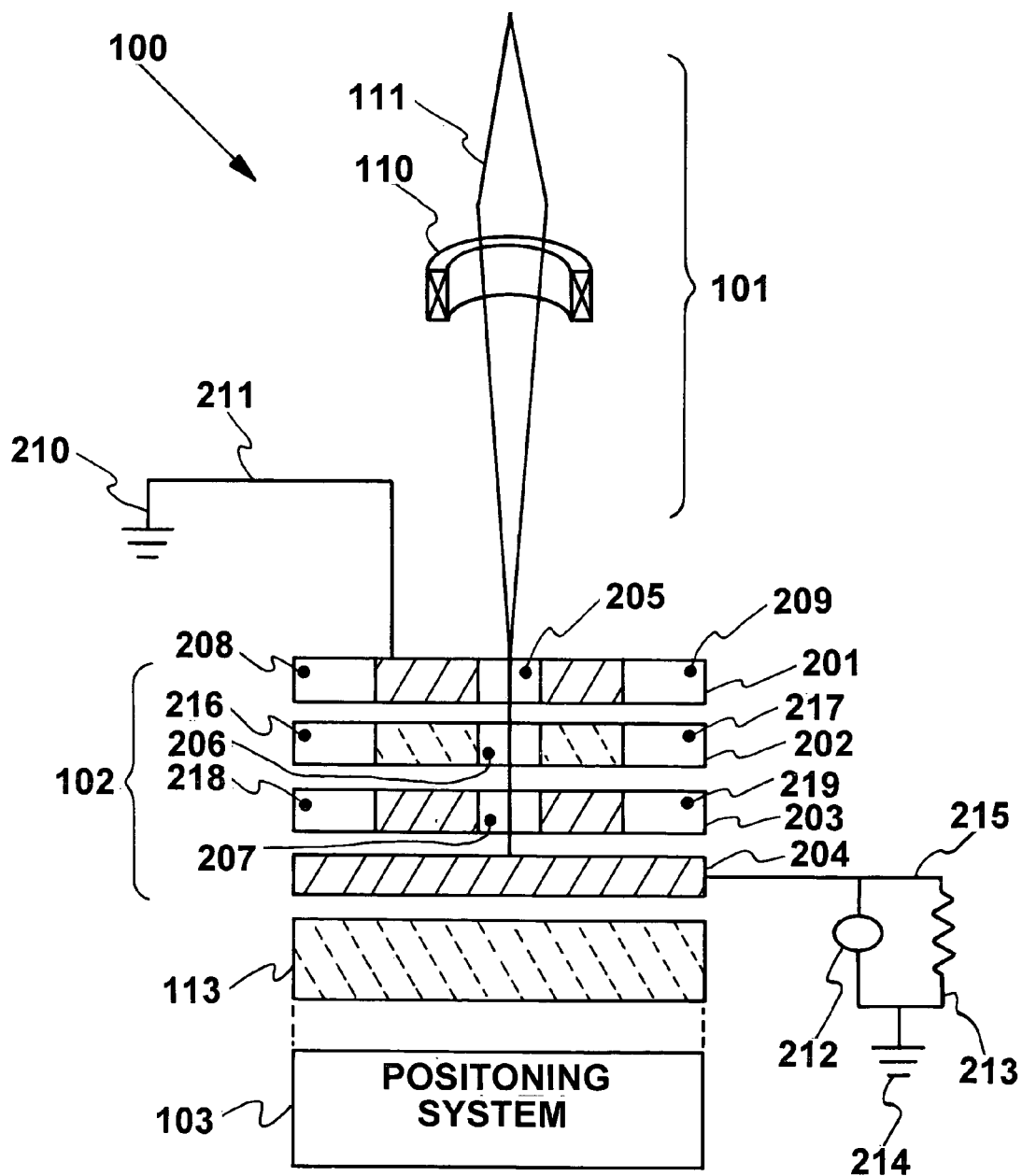
FIG. 2 is a schematic illustration showing additional details of the diagnostic system for micro beams illustrated in FIG. 1.

Referring now to FIG. 2, a schematic illustration shows additional details of the diagnostic system for micro beams 100 that was previously described and illustrated in FIG. 1. The system 100 includes the interconnected components or systems comprising the electron beam gun system 101, the micro modified Faraday cup (MFC) system 102, the positioning system 103, and the control and data acquisition system 104.

The micro MFC system 102 consists of four layers of materials, the top (first) layer 201, two middle layers 202 and 203, and the bottom (fourth) layer 204. FIG. 2 is an exploded view and shows the top layer 201, the middle layers 202 and 203, bottom layer 204, the electrically insulating support 113, and the positioning system 103 separated for illustration purposes. In operation the top layer 201, middle layers 202 and 203, the bottom layer 204, the electrically insulating support 113, and the positioning system 103 are adjacent and in contact with each other.

The top layer 201 of the micro modified Faraday cup (MFC) system 102 comprises an electrically conductive refractory material, such as tungsten. The top layer 201 is electrically connected to a ground 210 by the electrical connection 211. The top layer 201 contains a hole 205 and a multitude of radially oriented slits. For illustration purposes, slit 208 and slit 209 are shown in FIG. 2. Refractory materials are required to prevent damage to the layer 201 by the high intensity beam 111. This material should also have a high average atomic number to intercept the beam 111, and be sufficiently thick to prevent the beam 111 from penetrating through to the layers 202, 203, 204, and 113 below. The width of the slits, 208 and 209 are approximately 10% of the beam diameter (0.1 micron wide for a 1 micron diameter beam).

The layer 202 directly below the layer 201 is made of an electrically insulating material such as silicon or alumina. It has a similar thickness as the layer 201. The layer 202 contains a hole and the same number of slits as the first layer 201. As shown in FIG. 2, layer 202 contains the hole 206 and slits 216 and 217.

The layer 203 directly below the layer 202 is made of an electrically conducting material such as copper. The layer 203 contains the hole 207 and the same number of slits as the layers 201 and 202. As shown in FIG. 2, layer 203 contains the hole 207 and slits 218 and 219.

The three layers 201, 202, and 203 contain the holes that are aligned. The holes 205, 206, and 207 are slightly larger than the typical beam diameter. When the beam is passed, unobstructed, through the holes 205, 206, and 207, the micro MFC device acts as a conventional Faraday cup, so that the micro beam 111 can be positioned directly above the holes 205, 206, and 207 to measure the full beam current. The three layers 201, 202, and 203 contain the slits 208, 216, and 217 that are aligned and the slits 209, 217, and 219 that are aligned.

The fourth layer 204, directly below the layer 203, is made of an electrically conducting material such as copper but does not contain holes or slits. The fourth layer 204 captures the electrons or ions from the beam 111 that pass through the holes and slits above it. The fourth layer 204 connects to an electrical measuring system that processes the data obtained from the micro beam 111 into a form suitable fro use by the computer tomography algorithm. The electrical measuring system includes a measuring device 212 a resistor 213, a ground 214, and electrical connections 215.

The system 100 provides diagnostics for measuring the power density distribution of micro beams. During operation, the micro beam 111 is oscillated about the central point of the micro MFC 102 over the aligned radial slits 208, 216, 218 and the aligned radial slits 209, 217, and 219. Electrons or ions striking the first layer 201 are carried off to electrical ground 210, while those passing through the aligned radial slits 208, 216, 218 and the aligned radial slits 209, 217, and 219 are intercepted by the fourth layer 204 of the micro MFC where they are conducted through the ground path resistor 213 and measuring device 212 connected to the data acquisition system 104 to measure the profile of the beam. Computed tomography can then be used to reconstruct the power density distribution of the micro beam. Higher resolution of the power density distribution of the beam can be attained by manipulating the micro MFC 102 on the positioning stage 103 in small angular increments. This allows multiple data sets to be combined to provide higher spatial resolution to the CT reconstructed beam. The "X," "Y," and "Z" movements of the MFC 102 are adjusted by the operator and/or set by computer control in the control and data acquisition system 104.

The micro MFC device can be manufactured with different sized slits and different dimensions to measure the properties of different sized beams. Applicants chose a 1 micron as a beam diameter as an example, but smaller or larger beams can be inspected with different sized micro MFCs. To scale the device up or down, the slit width should be no larger than 10% of the beam diameter for high resolution measurements. The diameter of the micro MFC needs to be large enough so that the beam doesn't pass through two slits simultaneously. Larger beams can be inspected with a given MFC as long as the beam diameter doesn't exceed the distance between slits, which can easily be determined from the number of the slits, their width and the diameter of the micro MFC device.

Micro beams with dimensions on the order of 1 micron diameter or smaller are expected to be used extensively for micro joining applications in the future. Beams of these dimensions or smaller are already used for electron beam lithography, micro characterization in scanning and transmission electron microscopy, and focused and micro ion beam implantation. All of these techniques and processes will benefit from a beam characterization technique that rapidly measures the quality of the electron or ion beam. Using a scanning electron microscope (SEM) as an example of a micro beam, Applicants scaled down the dimensions of the MFC diagnostic device to the dimensions required to be used on a 1 micron diameter beam having a maximum of 100 µA of current accelerated to 30 kV voltage. These operating parameters simulate the beam that can be generated on standard SEMs.

The diagnostic system 100 provides a system for rapidly measuring the power density distribution of a micro electron or an ion beam. The system captures multiple micro beam profiles at different radial angles in a fraction of a second as the beam is oscillated in a circular pattern over a micro diagnostic device. The individual beam profiles are then reconstructed using a computed tomographic method to render an image of the beam shape, size, and power density distribution. The data is gathered and displayed within seconds, enabling near real time adjustments to be made to correct beam problems, such as focusing irregularities, beam astigmatism, and other effects leading to non-symmetric or non-optimum beams. In addition to correcting beam problems, the diagnostic device provides a permanent record of the beam for quality control purposes; a device to repeat the same beam quality on the same machine over a period of time, and a device to transfer beam quality characteristics to multiple machines.

The diagnostic system 100 has use for characterization of micro electron beams used for electron microscopy (scanning or transmission), micro charged particle beams used for micro-joining applications, micro ion beams or focused ion beams used for ion implantation or characterization. The diagnostic system 100 can be used for characterization of any charged particle beams used for lithography, or ion implantation on a micro scale.

Figure 3:
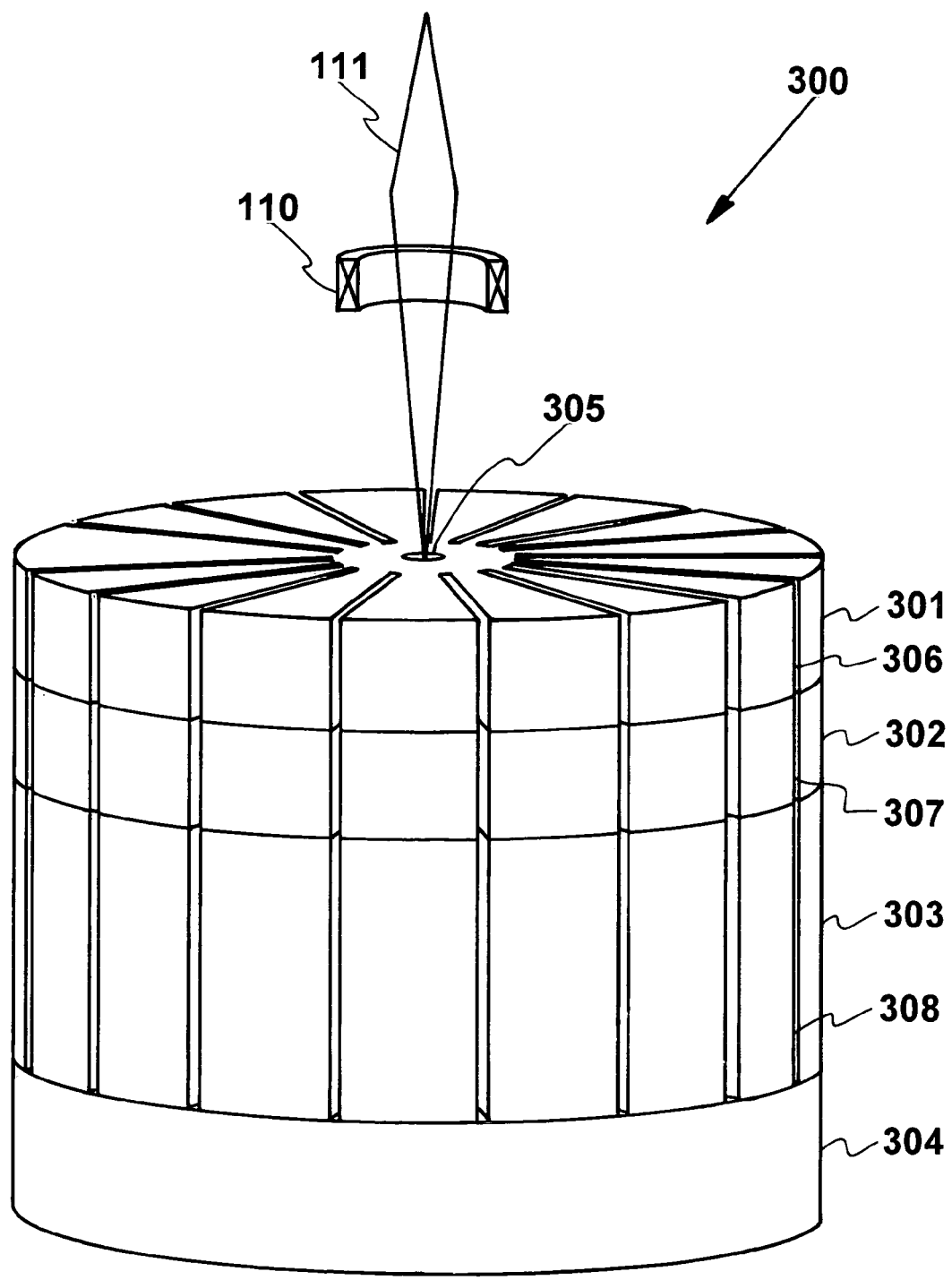
FIG. 3 is a pictorial illustration of another embodiment of a micro modified Faraday cup system constructed in accordance with the present invention.

Referring now to FIG. 3, a specific embodiment of a micro modified Faraday cup system constructed in accordance with the present invention is illustrated. This embodiment of a micro modified Faraday cup system is designated by the reference numeral 300. The micro MCF system 300 consists of four layers of materials, a top (first) layer 301, a middle layer (second) 302, a middle layer (third) 303, and a bottom (fourth) layer 304.

The top layer 301 of the micro modified Faraday cup (MFC) system 102 comprises an electrically conductive refractory material, such as tungsten. The top layer 301 is electrically connected to a ground by an electrical connection in the same manner as the embodiment of a micro modified Faraday cup system 102 shown in FIG. 2. The top layer 301 contains a hole 305 and a multitude of radially oriented slits 306. Refractory materials are used for the top layer 301 to prevent damage to the layer 301 by the high intensity beam. This material should also have a high average atomic number to intercept the beam, and be sufficiently thick to prevent the beam from penetrating through to the layers 302, 303, and 304 below. The width of the slits 306 are approximately 10% of the beam diameter (0.1 micron wide for a 1 micron diameter beam).

The layer 302 directly below the layer 301 is made of an electrically insulating material such as silicon or alumina. It has a similar thickness as the layer 301. The layer 302 contains a hole (not visible in FIG. 3) that is aligned with the hole 305 in the top layer 301. The layer 302 contains the same number of slits as the first layer 301. As shown in FIG. 3, layer 302 contains the slits 307 that are aligned with the slits 306.

The layer 303 directly below the layer 302 is made of an electrically conducting material. The layer 303 contains a hole (not visible in FIG. 3) that is aligned with the hole in the layer 302. The hole 305 in the top layer 301, the hole in the layer 302, and the hole in the layer 303 are aligned. The layer 303 contains the same number of slits as the top layer 201 and the layer 302. As shown in FIG. 3, the layer 303 contains the slits 308 that are aligned with the slits 307 in the layer 302. The slits 306 in the top layer 301, the slits 307 in the layer 302, and the slits 308 in the layer 303 are aligned.

The fourth layer 304, directly below the layer 303, is made of an electrically conducting material such as copper but does not contain holes or slits. The fourth layer 304 captures the electrons or ions from the beam that pass through the holes and slits above it. The fourth layer 304 is connected to an electrical measuring system that processes the data from the micro beam into a form suitable for sue by the computer tomography algorithm. The electrical measuring system is the same as the embodiment of a micro modified Faraday cup system 102 shown in FIG. 2, or electrical measuring system is the type of measuring system used in the art.

Unlike the system shown in FIG. 2, the embodiment of a micro modified Faraday cup system 300 does not utilize a positioning stage. A positioning stage system is not absolutely necessary for the operation of a diagnostic system for micro beams constructed in accordance with the present invention. The embodiment 300 of a diagnostic system for micro beams could use some system to move the micro modified Faraday cup in and out of the beam path; however, such a system is not essential and is an optional system that could, if desired, be included. The use of a positioning stage is meant as a tool to increase the resolution of the diagnostic by taking data with the diagnostic in one position, rotating the device a given number of degrees, and taking another set of data. By combining these two data sets, twice as much data is available to reconstruct the power density of the beam.

The system 300 provides diagnostics by measuring the power density distribution of micro beams. During operation, the micro beam is oscillated about the central point of the micro MFC 300 over the aligned radial slits 306, 307, and 308. Electrons or ions striking the first layer 301 are carried off to electrical ground, while those passing through the aligned radial slits 306, 307, and 308 are intercepted by the fourth layer 304 of the micro MFC 300 and the information is provided to the data acquisition system to measure the profile of the beam. Computed tomography can then be used to reconstruct the power density distribution of the micro beam.

The micro MFC 300 can be manufactured with different sized slits and different dimensions to measure the properties of different sized beams. Applicants chose a 1 micron as a beam diameter as an example, but smaller or larger beams can be inspected with different sized micro MFCs. To scale the device up or down, the slit width should be no larger that 10% of the beam diameter for high resolution measurements.

Figure 4:
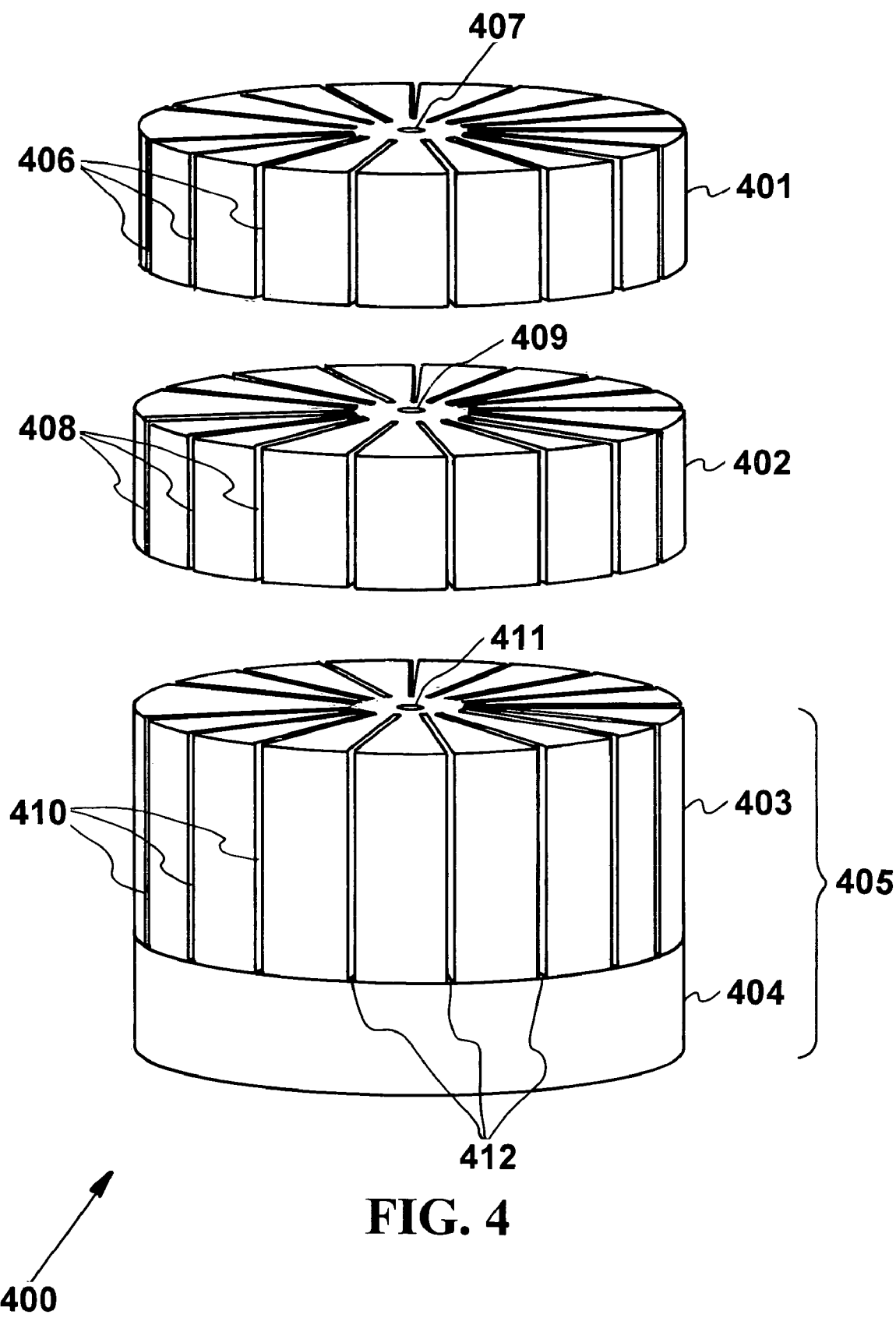
FIG. 4 is a pictorial illustration of yet another embodiment of a micro modified Faraday cup system constructed in accordance with the present invention.

Referring now to FIG. 4, a pictorial illustration shows another embodiment of a micro modified Faraday cup system constructed in accordance with the present invention. The embodiment illustrated in FIG. 4 is designated generally by the reference numeral 400. As previously described, the micro MCF system comprise of four layers of materials, a first layer, a second layer, a third layer, and a fourth layer. In the embodiment 400 shown in FIG. 4 the third layer and the fourth layer are combined into a single unit.

As illustrated in FIG. 4, the micro modified Faraday cup system 400 includes four layers of materials, a first layer 401, a second layer 402, a third layer 403, and a fourth layer 404. The third layer 403 and the fourth layer 404 are combined into a single unit 405. The single integral unit 405 is made of a conducting material such as copper. The first layer 401, the second layer 402 and the single unit 405 are illustrated in an exploded view. In operation the first layer 401, the second layer 402 and the single unit 405 are positioned together.

The first layer 401 contains a multiplicity of slits 406 and a hole 407. The slits 406 and the hole 407 extend through the first layer 401. The slits 406 are slightly smaller than the typical beam diameter.

The second layer 402 contains a multiplicity of slits 408 and a hole 409. The slits 408 and the hole 409 extend through the second layer 402. The slits 408 are slightly smaller than the typical beam diameter.

As illustrated in FIG. 4, the single unit 405 comprising the layer 403 and the layer 404 contains slits 410; however, the slits 410 only extend through the layer 403 and do not extend through the layer 404. The bottoms 412 of the slits 410 are located in the layer 403 illustrating that the slits 410 end in layer 403 and do not extend through the layer 404. The slits 410 are aligned with the slits 408 in the layer 402 and the slits 406 in the layer 401. The aligned slits are slightly smaller than the typical beam diameter. The micro beam is oscillated over the aligned slits 406, 408, and 410. Electrons or ions passing through the aligned slits are captured by the layer 404 and passed to a measuring device. The information obtained is provided to a data acquisition system to measure the profile of the beam. Computed tomography can then be used to reconstruct the power density distribution of the micro beam.

As illustrated in FIG. 4, the single unit 405 contains a hole 411. The hole 411 extends through the third layer 403 but does not extend through the fourth layer 404. When the beam is passed unobstructed through the hole 411, the micro MFC device acts as a conventional Faraday cup, so that the micro beam can be positioned directly above the holes 407 and 408 in the two layers above. The fourth layer 404 of the single unit 405 intercepts the electrons or ions from the beam that pass through the holes 407, 409, and 411. The aligned holes act as a conventional Faraday cup, so that the micro beam can be positioned directly above the holes to measure the full beam current.

Unlike the system shown in FIG. 2, the embodiment 400 of a micro modified Faraday cup system illustrated in FIG. 4 does not utilize a rotatable/movable MFC positioning stage. A positioning stage is not absolutely necessary for the operation of a diagnostic system for micro beams constructed in accordance with the present invention.

The structural components of different embodiments of a diagnostic system for micro beams constructed in accordance with the present invention having been described and illustrated in FIGS. 1, 2, 3, and 4; the overall construction and operation of the diagnostic system will now be considered. The diagnostic system provides diagnostics by measuring the power density distribution of micro beams. During operation, the micro beam is oscillated about the radial slits. The electrons or ions striking the first layer are carried off to electrical ground, while those passing through the slits are intercepted by the fourth layer of the micro MFC where they are measured by a measuring device connected to the data acquisition system to measure the profile of the beam. Computed tomography can then be used to reconstruct the power density distribution of the micro beam. When desired, the micro MFC can be placed on the positioning stage and the micro MFC can be repositioned and rotated about its center in small angular increments. This allows multiple data sets to be combined to provide higher spatial resolution to the CT reconstructed beam.

Data is taken by sweeping the beam orthogonally across the slits and measuring the beam current passing through the slits. This integrated slice of beam current is measured by the data acquisition system as the beam moves across the slits, producing a time record referred to as a beam profile. Knowing the beam sweep speed and the value of the current viewing resistor, the integrated beam current is determined as a function of position. These beam profiles are stored in the control and data acquisition system.

The micro MFC device can be manufactured with different sized slits and different dimensions to measure the properties of different sized beams. Applicants chose a 1 micron as a beam diameter as an example, but smaller or larger beams can be inspected with different sized micro MFCs. To scale the device up or down, the slit width should be no larger that 10% of the beam diameter for high resolution measurements. The diameter of the micro MFC needs to be large enough so that the beam doesn't pass through two slits simultaneously. Larger beams can be inspected with a given MFC as long as the beam diameter doesn't exceed the distance between slits, which can easily be determined from the number of the slits, their width and the diameter that the diameter of the micro MFC device.

Micro beams with dimensions on the order of 1 micron diameter or smaller are expected to be used extensively for micro joining applications in the future. Beams of these dimensions or smaller are already used for electron beam lithography, micro characterization in scanning and transmission electron microscopy, and focused and micro ion beam implantation. All of these techniques and processes benefit from a beam characterization technique that rapidly measures the quality of the electron or ion beam. Using a scanning electron microscope (SEM) as an example of a micro beam, Applicants scaled down the dimensions of the MFC diagnostic device to the dimensions required to be used on a 1 micron diameter beam having a maximum of 100 μA of current accelerated to 30 kV voltage. These operating parameters simulate the beam that can be generated on standard SEMs.

The diagnostic system provides a system for rapidly measuring the power density distribution of a micro electron or an ion beam. The system captures multiple micro beam profiles at different radial angles in a fraction of a second as the beam is oscillated in a circular pattern over a micro diagnostic device. The individual beam profiles are then reconstructed using a computed tomographic method to render an image of the beam shape, size, and power density distribution. The data is gathered and displayed within seconds, enabling near real time adjustments to be made to correct beam problems such as focusing irregularities, beam astigmatism, and other effects leading to non-symmetric or non-optimum beams. In addition to correcting beam problems, the diagnostic device provides a permanent record of the beam for quality control purposes, a device to repeat the same beam quality on the same machine over a period of time, and a device to transfer beam quality characteristics to multiple machines.

The diagnostic system has use for characterization of micro electron beams used for electron microscopy (scanning or transmission), micro charged particle beams used for micro-joining applications, micro ion beams or focused ion beams used for ion implantation or characterization. The diagnostic system 100 can be used for characterization of any charged particle beams used for lithography, or ion implantation on a micro scale.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. An apparatus for characterization of a micro beam, comprising:
    a micro modified Faraday cup assembly positioned in the path of the micro beam, said micro modified Faraday cup assembly including
    a first layer of material, said first layer of material comprising an electrical conducting refractory material and having at least one first layer radial slit extending through said first layer;
    an electrical ground connected to said first layer;
    a second layer of material operatively connected to said first layer of material, said second layer of material comprising an insulating material and having at least one second layer radial slit that is aligned with said first layer radial slit, said second layer radial slit extending through said second layer;
    a third layer of material operatively connected to said second layer of material, said third layer of material comprising a conducting material and having at least one third layer radial slit that is aligned with said second layer radial slit, said third layer radial slit extending through said third layer;
    a fourth layer of material operatively connected to said third layer of material, said fourth layer comprising an electrical conducting material; and
    a electrical measuring device connected to said fourth layer.

2. The apparatus for characterization of a micro beam of claim 1 wherein said third layer of material and said fourth layer of material comprise a single unit.

3. The apparatus for characterization of a micro beam of claim 1 including a positioning system operatively connected to said micro modified Faraday cup assembly for changing the position of said micro modified Faraday cup assembly relative to the micro beam.

4. The apparatus for characterization of a micro beam of claim 1 wherein the micro beam passes through said first layer radial slit in said first layer of material, through said second layer radial slit in said second layer of material, and through said third layer radial slit in said third layer of material to said fourth layer of material where it is measured by said electrical measuring device.

5. The apparatus for characterization of a micro beam of claim 1 wherein said first layer of material comprises an electrically conductive refractory material.

6. The apparatus for characterization of a micro beam of claim 5 wherein said electrically conductive refractory material comprises tungsten.

7. The apparatus for characterization of a micro beam of claim 1 wherein said first layer of material has a high average atomic number to intercept the beam.

8. The apparatus for characterization of a micro beam of claim 1 wherein said first layer of material is sufficiently thick to prevent the beam from penetrating through said first layer.

9. The apparatus for characterization of a micro beam of claim 1 wherein said second layer of material comprises an electrically insulating material.

10. The apparatus for characterization of a micro beam of claim 9 wherein said electrically insulating material comprises silicon.

11. The apparatus for characterization of a micro beam of claim 9 wherein said electrically insulating material comprises alumina.

12. The apparatus for characterization of a micro beam of claim 1 wherein said third layer comprises an electrically conducting material such as copper.

13. The apparatus for characterization of a micro beam of claim 1 wherein said third layer comprises copper.

14. The apparatus for characterization of a micro beam of claim 1 wherein said fourth layer of material is positioned to intercept the micro beam that passes through said first layer radial slit, through said second layer radial slit, and through said third layer radial slit.

15. The apparatus for characterization of a micro beam of claim 1 wherein the beam has a diameter and the width of said first layer radial slit, the width of said second layer radial slit, and the with of said third layer radial slit are approximately 10% of said diameter of the beam.

16. The apparatus for characterization of a micro beam of claim 1 including a first layer hole in said first layer of material, a corresponding second layer hole in said second layer of material, and a corresponding third layer portion layer hole in said third layer with at least one third layer radial slit.

17. The apparatus for characterization of a micro beam of claim 16 wherein said first layer hole in said first layer of material, said corresponding second layer hole in said second layer of material act, and said third layer hole in said third layer act as a conventional Faraday cup whereby the micro beam can be positioned directly above said first layer hole in said first layer of material, said corresponding second layer hole in said second layer of material, and said third layer hole in said third layer to measure the full micro beam current.

18. The apparatus for characterization of a micro beam of claim 1 wherein the micro beam passes through said first layer radial slit in said first layer of material, through said second layer radial slit in said second layer of material, and through said third layer radial slit in said third layer of material to said fourth layer of material where the beam profile is measured by said electrical measuring device, and including a positioning system operatively connected to said micro modified Faraday cup assembly for changing the position of said micro modified Faraday cup assembly relative to the micro beam thereby enabling said electrical measuring device to capture multiple micro beam profiles at different angles.

19. The apparatus for characterization of a micro beam of claim 1 wherein the micro beam passes through said first layer radial slit in said first layer of material, through said second layer radial slit in said second layer of material, and through said third layer radial slit in said third layer of material to said fourth layer of material where the beam profile is measured by said electrical measuring device, and including a control and data acquisition system operatively connected to said electrical measuring device that reconstructs the beam profile.

20. The apparatus for characterization of a micro beam of claim 1 including a control and data acquisition system operatively connected to said electrical measuring device that uses a computed tomographic method to render an image of the micro beam shape.

21. The apparatus for characterization of a micro beam of claim 1 including a control and data acquisition system operatively connected to said electrical measuring device that uses a computed tomographic method to render an image of the micro beam size.

22. The apparatus for characterization of a micro beam of claim 1 including a control and data acquisition system operatively connected to said electrical measuring device that uses a computed tomographic method to render an image of the micro beam power density distribution.

23. The apparatus for characterization of a micro beam of claim 1 wherein the micro beam passes through said first layer radial slit in said first layer of material, through said second layer radial slit in said second layer of material, and through said third layer radial slit in said third layer of material to said fourth layer of material where the micro beam profile is measured by said electrical measuring device, and including a positioning system operatively connected to said micro modified Faraday cup assembly for changing the position of said micro modified Faraday cup assembly relative to the micro beam thereby enabling said electrical measuring device to capture multiple micro beam profiles at different angles, and including a control and data acquisition system operatively connected to said electrical measuring device that uses a computed tomographic method to render an image of said multiple micro beam profiles.

24. The apparatus for characterization of a micro beam of claim 1 including a control and data acquisition system operatively connected to said electrical measuring device that uses a computed tomographic method to correct micro beam astigmatism.

25. The apparatus for characterization of a micro beam of claim 1 including a control and data acquisition system operatively connected to said electrical measuring device that uses a computed tomographic method to correct micro beam effects leading to non-symmetric beams.

26. The apparatus for characterization of a micro beam of claim 1 including a control and data acquisition system operatively connected to said electrical measuring device that uses a computed tomographic method to correct micro beam effects leading to non-optimum beams.

27. The apparatus for characterization of a micro beam of claim 1 including a control and data acquisition system operatively connected to said electrical measuring device that uses a computed tomographic method to correct micro beam problems including focusing irregularities, beam astigmatism, and other effects leading to non-symmetric or non-optimum beams.

28. The apparatus for characterization of a micro beam of claim 1 including a control and data acquisition system operatively connected to said electrical measuring device that uses a computed tomographic method to provide a permanent record of the micro beam.

29. The apparatus for characterization of a micro beam of claim 1 including a control and data acquisition system operatively connected to said electrical measuring device that uses a computed tomographic method to provide a permanent record of the micro beam for quality control.

30. The apparatus for characterization of a micro beam of claim 1 including a control and data acquisition system operatively connected to said electrical measuring device that uses a computed tomographic method to provide a permanent record of the micro beam to provide a system for repeating the same micro beam quality on the same machine over a period of time.

31. The apparatus for characterization of a micro beam of claim 1 including a control and data acquisition system operatively connected to said electrical measuring device that uses a computed tomographic method to provide a permanent record of the micro beam to provide a system for transferring the micro beam quality characteristics to multiple machines.

32. The apparatus for characterization of a micro beam of claim 1 including a control and data acquisition system operatively connected to said electrical measuring device that uses a computed tomographic method to provide a permanent record of the micro beam for documentation of uses made of the micro beam.

33. The apparatus for characterization of a micro beam of claim 1 wherein the micro beam is a micro electron beam.

34. The apparatus for characterization of a micro beam of claim 1 wherein the micro beam is an ion beam.

35. A method for the characterization of a micro beam, comprising the steps of:
providing a micro modified Faraday cup assembly comprising a first layer of material, said first layer of material comprising an electrical conducting refractory material and having at least one first layer radial slit extending through said first layer, an electrical ground connected to said first layer, a second layer of material operatively connected to said first layer of material, said second layer of material comprising an insulating material and having at least one second layer radial slit that is aligned with said first layer radial slit, said second layer radial slit extending through said second layer, a third layer of material operatively connected to said second layer of material, said third layer of material comprising a conducting material and having at least one third layer radial slit that is aligned with said second layer radial slit, said third layer radial slit extending through said third layer, a fourth layer of material operatively connected to said third layer of material, said fourth layer comprising an electrical conducting material, and a electrical measuring device connected to said fourth layer;

directing the micro beam through said first layer radial slit in said first layer of material, through said second layer radial slit in said second layer of material, through said third layer radial slit in said third layer of material to said fourth layer of material; and measuring the micro beam profile with said electrical device.

36. The method for the characterization of a micro beam of claim 35 including the steps of providing a positioning system operatively connected to said micro modified Faraday cup assembly for changing the position of said micro modified Faraday cup assembly relative to the micro beam, using said positioning system for changing the position of said micro modified Faraday cup assembly relative to the micro beam, and measuring micro beam profiles at different angles with said electrical device.

37. The method for the characterization of a micro beam of claim 35 including the step of providing a control and data acquisition system operatively connected to said electrical measuring device and using said control and data acquisition system and a computed tomographic method to render an image of the micro beam shape.

38. The method for the characterization of a micro beam of claim 35 including the step of providing a control and data acquisition system operatively connected to said electrical measuring device and using said control and data acquisition system and a computed tomographic method to render an image of the micro beam size.

39. The method for the characterization of a micro beam of claim 35 including the step of providing a control and data acquisition system operatively connected to said electrical measuring device and using said control and data acquisition system and a computed tomographic method to render an image of the micro beampower density distribution.

40. The method for the characterization of a micro beam of claim 35 including the step of providing a control and data acquisition system operatively connected to said electrical measuring device and using said control and data acquisition system and a computed tomographic method to render an image of the micro beam shape, size, and power density distribution.

41. The method for the characterization of a micro beam of claim 35 including the step of providing a control and data acquisition system operatively connected to said electrical measuring device and using said control and data acquisition system and a computed tomographic method to correct micro beam astigmatism.

42. The method for the characterization of a micro beam of claim 35 including the step of providing a control and data acquisition system operatively connected to said electrical measuring device and using said control and data acquisition system and a computed tomographic method to correct micro beam effects leading to non-symmetric beams.

43. The method for the characterization of a micro beam of claim 35 wherein said micro modified Faraday cup assembly includes a control and data acquisition system operatively connected to said electrical measuring device and including the step of using a computed tomographic method to correct micro beam effects leading to non-optimum beams.

44. The method for the characterization of a micro beam of claim 35 including the step of providing a control and data acquisition system operatively connected to said electrical measuring device and using said control and data acquisition system and a computed tomographic method to correct micro beam problems including focusing irregularities, beam astigmatism, and other effects leading to non-symmetric or non-optimum beams.

45. The method for the characterization of a micro beam of claim 35 including the step of providing a control and data acquisition system operatively connected to said electrical measuring device and using said control and data acquisition system and a computed tomographic method to provide a permanent record of the micro beam.

46. The method for the characterization of a micro beam of claim 35 including the step of providing a control and data acquisition system operatively connected to said electrical measuring device and using said control and data acquisition system and a computed tomographic method to provide a permanent record of the micro beam for quality control.

47. The method for the characterization of a micro beam of claim 35 including the step of providing a control and data acquisition system operatively connected to said electrical measuring device and using said control and data acquisition system and a computed tomographic method to provide a system for repeating the same micro beam quality on the same machine over a period of time.

48. The method for the characterization of a micro beam of claim 35 including the step of providing a control and data acquisition system operatively connected to said electrical measuring device and using said control and data acquisition system and a computed tomographic method to provide a permanent record of the micro beam to provide a system for transferring the micro beam quality characteristics to multiple machines.

49. The method for the characterization of a micro beam of claim 35 including the step of providing a control and data acquisition system operatively connected to said electrical measuring device and using said control and data acquisition system and a computed tomographic method to provide a permanent record of the micro beam for documentation of uses made of the micro beam.

50. The method for the characterization of a micro beam of claim 35 including the steps of providing a top layer hole in said top layer of material, providing a second layer hole in said second layer of material, providing a third layer hole in said third layer of material, positioning the micro beam directly above said top layer hole, said second layer hole, and said third layer hole, and using said electrical measuring device to measure the full micro beam current.

51. The method for the characterization of a micro beam of claim 35 including the steps of providing a positioning system operatively connected to said micro modified Faraday cup assembly for changing the position of said micro modified Faraday cup assembly relative to the micro beam, using said positioning system for changing the position of said micro modified Faraday cup assembly relative to the micro beam, and measuring micro beam profiles at different positions with said electrical device.

52. The method for the characterization of a micro beam of claim 50 including the step of providing a control and data acquisition system operatively connected to said electrical measuring device and using said control and data acquisition system to capture and store multiple micro beam profiles at different positions.

* * * * *